(12) United States Patent
Chen et al.

(10) Patent No.: US 9,817,306 B2
(45) Date of Patent: Nov. 14, 2017

(54) EXTREME ULTRAVIOLET (EUV) POD HAVING MARKS

(71) Applicant: GUDENG PRECISION INDUSTRIAL CO., LTD., New Taipei (TW)

(72) Inventors: Wei-Yen Chen, New Taipei (TW); Cheng-Ju Lee, New Taipei (TW); Long-Ming Lu, New Taipei (TW); Cheng-Hsin Chen, New Taipei (TW); Tien-Jui Lin, New Taipei (TW)

(73) Assignee: Gudeng Precision Industrial Co., Ltd., New Taipei (TW)

( * ) Notice: Subject to any disclaimer, the term of this patent is extended or adjusted under 35 U.S.C. 154(b) by 121 days.

(21) Appl. No.: 14/862,334

(22) Filed: Sep. 23, 2015

(65) Prior Publication Data

US 2016/0085144 A1   Mar. 24, 2016

(30) Foreign Application Priority Data

Sep. 24, 2014 (TW) .............................. 103216982 U

(51) Int. Cl.
  *G03F 1/22* (2012.01)
  *G03F 1/42* (2012.01)
  *G03F 1/66* (2012.01)

(52) U.S. Cl.
  CPC .................. *G03F 1/22* (2013.01); *G03F 1/42* (2013.01); *G03F 1/66* (2013.01)

(58) Field of Classification Search
  CPC ................. G03F 1/22; G03F 1/42; G03F 1/66
  USPC ............................................................ 430/5
  See application file for complete search history.

(56) References Cited

U.S. PATENT DOCUMENTS 7,808,616 B2* 10/2010 Yamamoto .......... G03F 7/70741
                                                                355/75
8,207,504 B2*  6/2012 Braude .................. B82Y 10/00
                                                                250/372

* cited by examiner

*Primary Examiner* — Christopher Young
(74) *Attorney, Agent, or Firm* — Rosenberg, Klein & Lee

(57) ABSTRACT

The present invention relates to an EUV pod having marks, which comprises a mask pod and one or more mark disposed on the mask pod. One or more sensor of a processing machine is used for detecting the one or more mark. By including the one or more mark, the surface roughness of one or more region of the mask pod detectable by the one or more sensor can be altered. The one or more sensor emits light to the mask pod, which reflects the light to the one or more sensor. The one or more sensor receives the reflection light from the mask pod and judges if the voltage generated by the reflection light falls within the reflection ranges of the mark. Thereby, whether the one or more sensor corresponds to the one or more make can be confirmed.

4 Claims, 5 Drawing Sheets

EXTREME ULTRAVIOLET (EUV) POD HAVING MARKS

FIELD OF THE INVENTION

The present invention relates generally to a mask pod, and particularly to an extreme ultraviolet (EUV) pod having marks.

CROSS REFERENCE TO RELATED APPLICATIONS

The application claims priority from Taiwan Application Serial Number 103216982, filed on Sep. 24, 2014.

BACKGROUND OF THE INVENTION

Technologies, in particular, semiconductor technologies, make progresses day by day. Wafers are among the most important materials for semiconductor fabrication. The major raw material of wafers is silicon dioxide. Wafers are processed by steps including deposition, etching, annealing, photoresist, coating, and development. A wafer can give tens of even hundreds of integrated circuits, depending on its size. In order to fabricate wafers having various circuits and electronic devices, masks are required for planning and designing in advance.

Masks are molds for fabricating wafers. While fabricating integrated circuits, the design of the integrated circuits is first fabricated on masks. The fabrication of masks are designed and planned according to the circuit design. If the circuit design is more complicated and fine, more layers of masks are possibly required.

In order to use masks for planning and designing circuits on wafers, photolithography should be adopted. The technology makes use of the principle of exposure. When light passes through a mask and projects to a silicon wafer, specific patterns can be exposed and rebuilt on the wafer. After the development process, the mask pod can be cleaned and reused repeatedly.

Mask pods can be categorized into front- and top-opening types. The opening of mask pod is directional. Thereby, wile loading a mask pod to a lithography machine, attention should be paid to the orientation of the mask pod. Otherwise, the mask pad might be inoperative. Alternatively, if the loaded position is shifted, although the opening of the mask pod is not affected, the exposure position is shifted during the photolithography process.

For avoiding the above conditions, positioning mechanisms are provided in the photolithography machine according to some references. The positioning mechanism uses the mechanisms designed on the mask pods to match those designed on the machines. Thereby, the mask pods can be loaded in a specific orientation with respect to the photolithography machines.

In addition, sensing devices are adopted for sensing the loading locations of mask pods for ensuring the precise positioning of the mask pods. According to some references, sensors sense the existence of a wafer pod and send a signal. Barcode scanner acquires the signal from the sensor and reads the identification code of the wafer pod. In the references, while using the sensors, the detection of the sensors might be unstable owing to the smooth surface of the mask pod. As a consequence, the locations of the characteristic regions on the mask pod cannot be judged precisely.

The present invention mitigates the drawbacks in the references and provides an EUV mask pod having marks. One or more mark is produced using laser engraving. By ensuring the voltage value generated by the reflection light from the one or more mark, it is judged whether the one or more mark is corresponded to the processing machine. Thereby, the processing machine can detect precisely if the mask pod is located at the processing location.

SUMMARY

An objective of the present invention is to provide an UEV pod having marks, which comprises one or more marks and judges if the one or more mark corresponding to one or more sensor of a processing machine according to the voltage value generated by the reflection light from the one or more mark. Thereby, the UEV pod can be located precisely to a processing location in the processing machine.

Another objective of the present invention is to provide an EUV pod having marks. One or more mark is formed on the EUV pod using laser engraving for changing the surface roughness of one or more region on the EUV pod corresponding to one or more sensor of the processing machine. Thereby, the voltage value generated by the reflection light from one or more mark is maintained within a certain range for subsequent positioning by the processing machine.

In order to achieve the above objectives and efficacies, the EUV pod having marks according to the present invention comprises a mask pod and one or more mark disposed on the mask pod. The mask pod is configured to be loaded to a processing machine. The processing machine detect the one or more mark.

In addition, the one or more mark is formed by laser engraving and includes surface roughness.

DETAILED DESCRIPTION

Figure 1A:
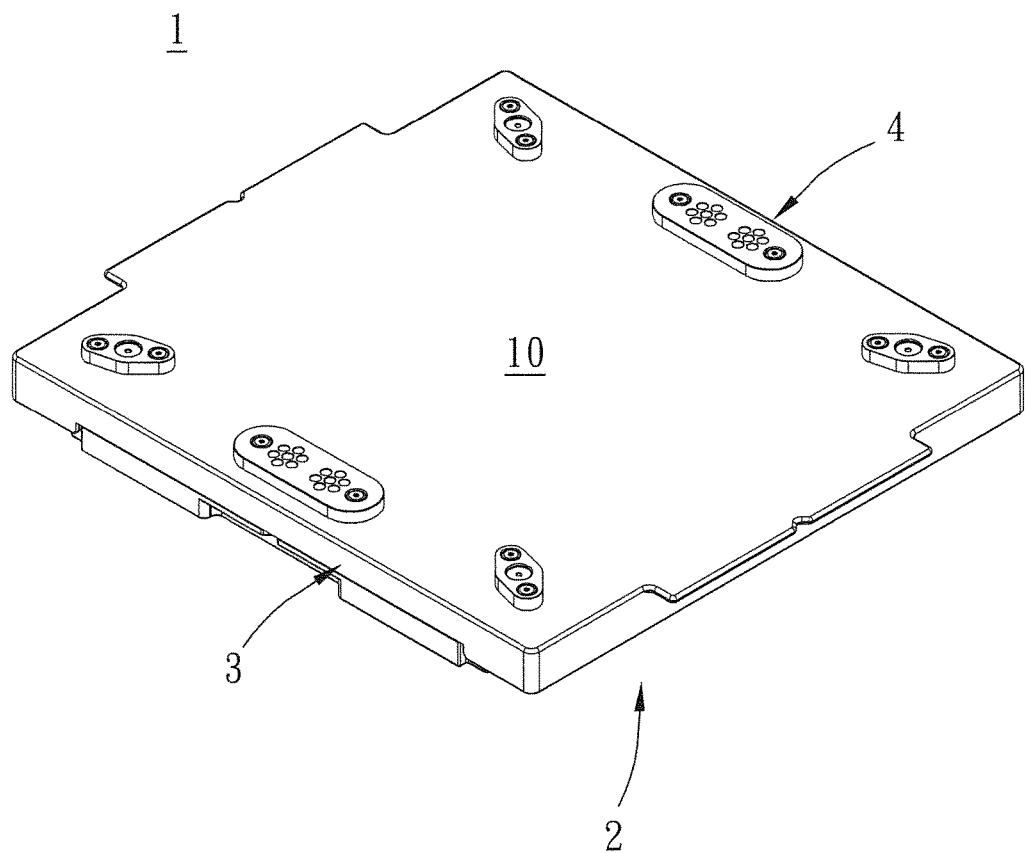
FIG. 1A shows a structural schematic diagram of the EUV pod according the first embodiment of the present invention.
Figure 1B:
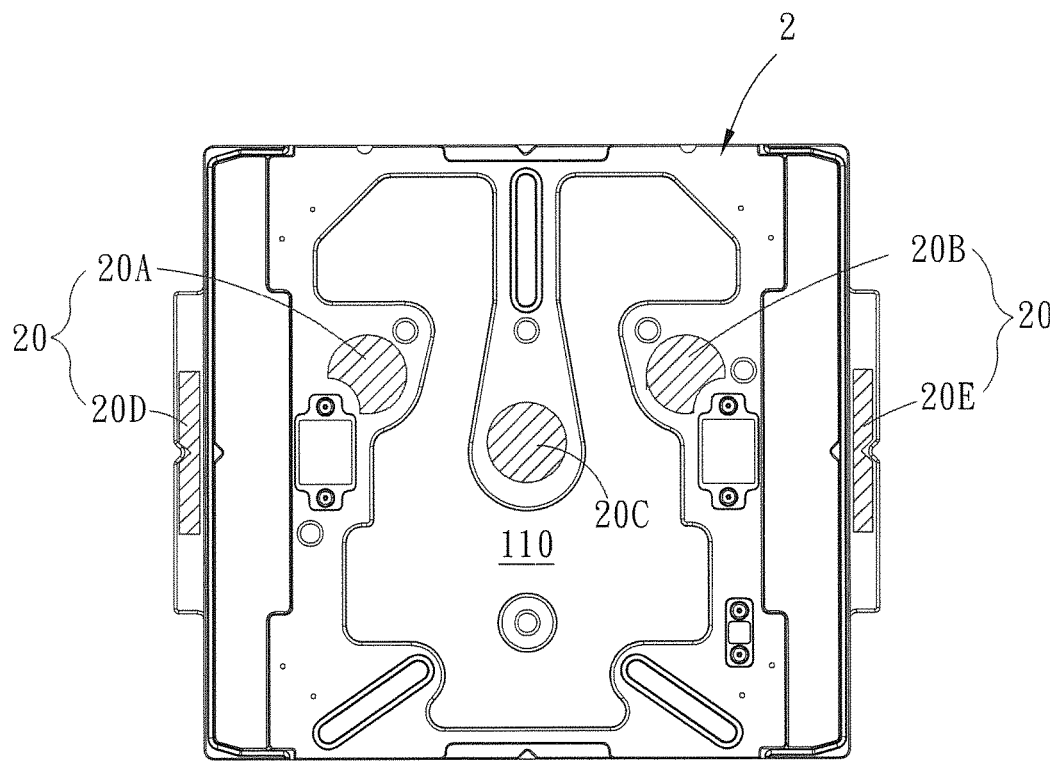
FIG. 1B shows a bottom view of the structure of the EUV pod according the first embodiment of the present invention.

In order to make the structure and characteristics as well as the effectiveness of the present invention to be further understood and recognized, the detailed description of the present invention is provided as follows along with embodiments and accompanying figures.

In the photolithography process according to the prior art, one or more sensor of a photolithography machine senses a mask pod for positioning it. Due to the smooth surface of the mask pod, the reflection light from the mask pod is unstable, disabling the one or more sensor to judge the location of the mask pod accurately. Consequently, the mask pod cannot be positioned accurately at the processing location in the photolithography machine.

Please refer to FIGS. 1A to 1G, which show a structural schematic diagram, a bottom view, a front view, a rear view, a schematic diagram of using the processing machine, a schematic diagram of the principle, and a schematic diagram of the resultant data of the EUV pod according to the first embodiment of the present invention. As shown in the figures, the present embodiment provides an EUV pod having marks 1, which comprises a mask pod 10 and one or more mark 20 disposed on the mask pod 10. The mask pod 10 is configured to be loaded to a processing machine 30, for example, a photolithography machine. One or more sensor 310 of the processing machine 30 detect the one or more mark 20.

The one or more mark 20 according to the present embodiment is disposed on a bottom surface 2, a front side surface 3, and a rear side surface 4 of the mask pod 10. Please refer to FIG. 1B, which shows the bottom surface 2 of the mask pod 10. The bottom surface 2 of the mask pod 10 according to the present embodiment includes a U-shaped recess 110. The one ore more mark 20, namely, a mark 20A and a mark 20B, can be disposed on both sides of the U-shaped recess 110. Alternatively, the one or more mark 20, namely, a mark 20C, can be disposed at the center surrounded by the U-shaped recess 110. Besides, a projective part 130 extends outwards and horizontally from both sides of the top surface of the mask pod 10, respectively. A mark 20D and a mark 20E are disposed on bottom surfaces of the two projective parts 130, respectively.

Figure 1C:
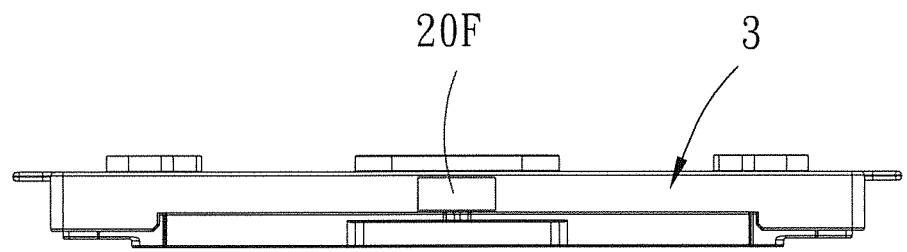
FIG. 1C shows a front view of the structure of the EUV pod according the first embodiment of the present invention.
Figure 1D:
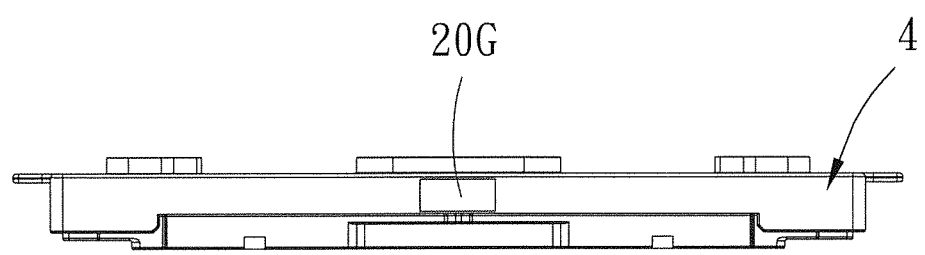
FIG. 1D shows a rear view of the structure of the EUV pod according the first embodiment of the present invention.

Please refer to FIGS. 1C and 1D, which show the front side surface 3 and the rear side surface 4 of the mask pod 10 according to the present embodiment. A mark 20F is disposed at the center of the front side surface 3; a mark 20G is disposed at the center of the rear side surface 4. The bottom surface 2, the front side surface 3, and the rear side surface 4 of the above mask pod 10 include one or more region 320 detectable by one or more sensor 310 when the mask pod 10 is configured to be loaded to the processing machine 30. In addition, the one or more mark 20 according to the present embodiment is formed in the one or more region 320 of the mask pod corresponding to the one or more sensor 310 of the processing machine 30 using laser engraving and includes surface roughness. By controlling the surface roughness of the one or more mark 20 within a certain range, the voltage generated by the reflection light from one or more mark 20 can be maintained within a certain range.

The locations for disposing the one or more mark 20 are not limited once they correspond to the one or more sensor 310 of the processing machine. Besides, the shape and style of the one or more mark 20 are not limited either.

Figure 1E:
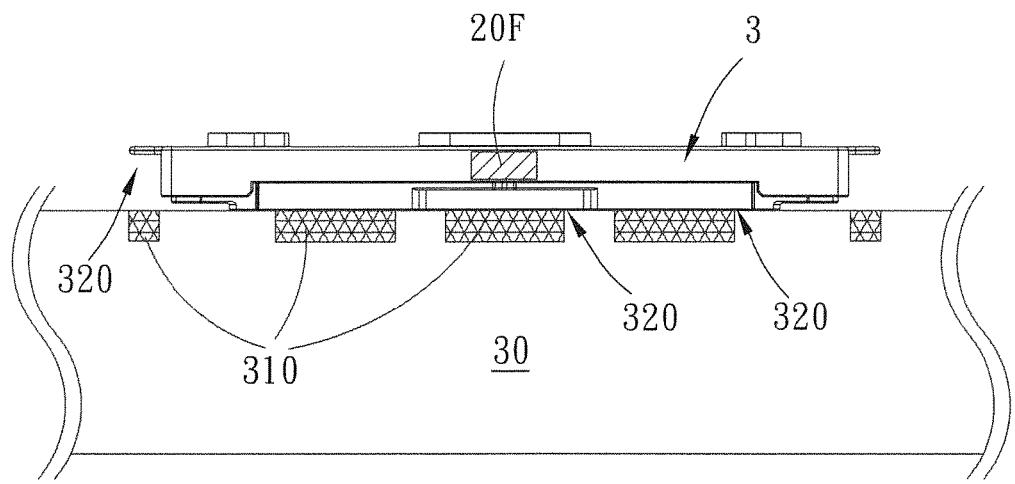
FIG. 1E shows a schematic diagram of using the processing machine according the first embodiment of the present invention.

Please refer to FIG. 1E. When the photolithography process is carried out using the EUV pod 1 according to the present embodiment, the mask pod 10 of the EUV pod 1 according to the present invention is loaded to the processing location of a photolithography machine (the processing machine 30). The photolithography machine comprises one or more sensor 310. The one or more sensor 310 emits light to the mask pod 10. If the mask pod 10 is already placed accurately at the processing location of the photolithography machine (the processing machine 30), the light emitted by the sensor 310 can illuminate the corresponding mark 20. The mark 20 reflects the light. The one or more sensor 310 receives the reflection light, and generates a voltage value under the photoelectric effect. Whether the voltage value generated by the reflection light falls within the reflection range is then judged for making sure that the mark 20 has corresponded to the one or more sensor 310. Consequently, it is confirmed that the mask pod 10 has already located at the processing location of the photolithography machine (the processing machine 30).

If the mask pod 10 is not located accurately at the processing location of the photolithography machine (the processing machine 30), instead of the corresponding mark 20 directly, the light emitted by the one or more sensor 310 illuminates the mask pod 10. The mask pod 10 without the mark 20 reflects the light. The one or more sensor 310 judges that the generated voltage is beyond the reflection range of the mark 20 according to the reflection light. At this moment, the one or more sensor 310 does not correspond to the mark 20, which means that the mask pod 10 is not placed accurately at the processing location of the photolithography machine (the processing machine 30). Then the photolithography machine (the processing machine 30) will emit a warning signal for reminding the user to reload the mask pod 10.

Figure 1F:
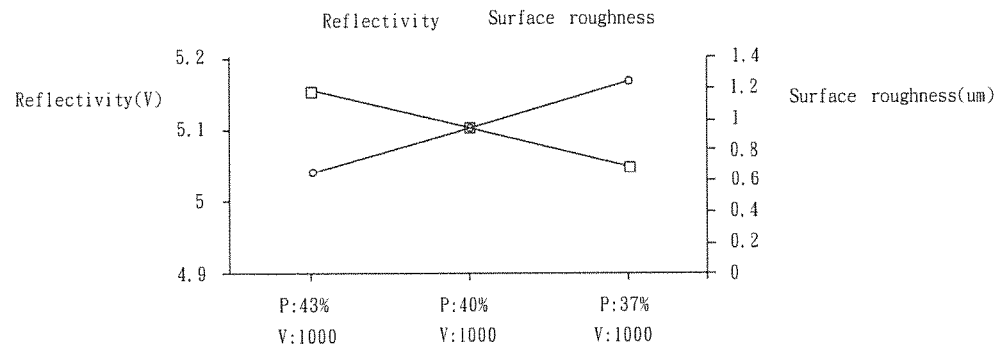
FIG. 1F shows a schematic diagram of the principle according the first embodiment of the present invention.

Please refer to FIG. 1F. The surface roughness of the one or more region 320 on the mask pod 10 detectable by the one or more sensor 310 is altered. The surface roughness of the one or more mark 20 influences the voltage value generated by the reflection light. If the surface is rougher, the reflectivity will be lower. For example, when the roughness is 1.19 um, the voltage generated by the reflection light is 5.04 volts. According to the present embodiment, the preferred surface roughness of the mark 20 ranges between 0 and 2.00 um, and the voltages generated by the corresponding reflection light falls between 4.8 and 5.2 volts. The surface roughness is inversely proportional to the generated voltage. Nonetheless, the present invention is not limited to the surface roughness range. The surface roughness can be set according to the user's requirements. The voltages generated by the reflection light will change according to the roughness.

Figure 1G:
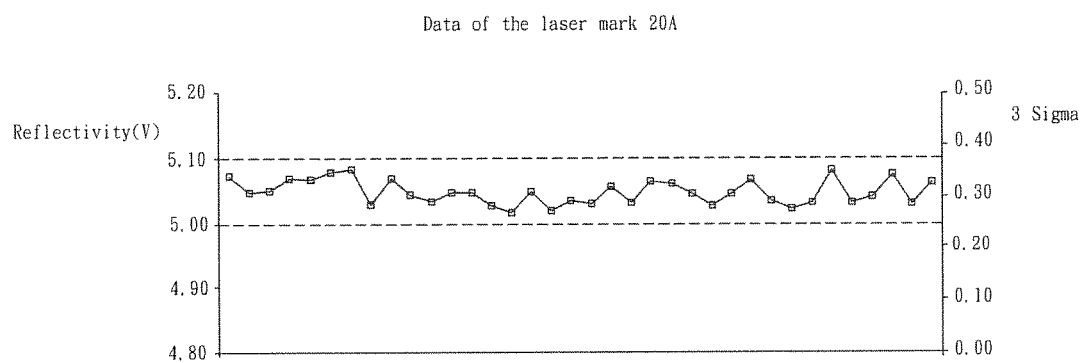
FIG. 1G shows a schematic diagram of the resultant data according the first embodiment of the present invention.

Please refer to FIG. 1G, which shows a resultant data diagram using the mark 20A as an example. After adjusting the surface roughness according to the above description and repeated experimental tests (one point illustrating an experimental datum), the average voltage values generated by the reflection light from the mark 20A falls between 5.00 and 5.10 volts. The 3-sigma standard deviation is controlled within 0.1.

The present embodiment provides an EUV pod having marks and uses the one or more sensor 310 of the processing machine 30 to detect the one or more mark 20. Thereby, the one or more sensor 310 can detect accurately the one or more mark 20 and ensure that its absolute location can correspond accurately to the processing location of the processing machine 30. Consequently, the mask pod 10 can be loaded at the processing location of the processing machine 30.

To sum up, the present invention uses the absolute location of the one or more mark to enable the mask pod to be loaded to the accurate processing location of the processing machine. The process of the processing machine will not start unless the location is confirmed. The one or more mark is fabricated on the mask pod using laser engraving and includes surface roughness controlled by laser engraving according to the user's requirements. The surface roughness influences the voltage value generated by the reflection light from the mask pod. By light first illuminates the one or more mark of the mask pod. The standard deviation of the voltage values generated by the reflection light should be controlled within a certain range. Otherwise, if the light does not illuminate the one or more mark correspondingly, the standard deviation of the voltage values generated by the reflection light cannot fall within the preset range stably.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. An extreme ultraviolet pod having marks, comprising:
a mask pod; and
one or more mark, disposed on said mask pod;
where said mask pod is configured to be loaded to a processing machine, and one or more sensor of said processing machine is configured to detect said one or more mark; said one or more mark is formed on said mask pod by laser engraving and includes surface roughness, and the surface roughness of said one or more mark ranges between 0 micrometer and 2.00 micrometers; said one or more sensor of said processing machine generates light to illuminate said one or more mark; said one or more mark reflects said light; and the voltage value generated by said reflection light from said one or more mark is produced according to the surface roughness of said one or more mark.

2. The extreme ultraviolet pod having mark of claim 1, wherein said one or more mark is disposed on one or more region of said mask pod corresponding to one or more sensor of said processing machine.

3. The extreme ultraviolet pod having mark of claim 1, wherein the voltage values generated by the reflection light from said one or more mark range from 4.80 volts and 5.20 volts.

4. The extreme ultraviolet pod having mark of claim 1, wherein the 3-sigma standard deviation of the voltage values generated by the reflection light from said one or more mark is controlled within 0.1.

* * * * *